(12) United States Patent
Xie

(10) Patent No.: US 6,495,385 B1
(45) Date of Patent: Dec. 17, 2002

(54) HETERO-INTEGRATION OF DISSIMILAR SEMICONDUCTOR MATERIALS

(75) Inventor: Ya-Hong Xie, Beverly Hills, CA (US)

(73) Assignee: The Regents of the University of California, Oakland, CA (US)

(*) Notice: Subject to any disclaimer, the term of this patent is extended or adjusted under 35 U.S.C. 154(b) by 112 days.

(21) Appl. No.: 09/633,354

(22) Filed: Aug. 4, 2000

Related U.S. Application Data

(60) Provisional application No. 60/151,452, filed on Aug. 30, 1999.

(51) Int. Cl.$^7$ ............................................. H01L 21/00
(52) U.S. Cl. ............................. 438/47; 257/76; 257/77; 438/503
(58) Field of Search ......................... 257/76, 77, 190, 257/201; 438/503, 478, 479

(56) References Cited

U.S. PATENT DOCUMENTS 6,177,688 B1 * 1/2001 Linthicum et al. .......... 257/190
6,265,289 B1 * 7/2001 Zheleva et al. ............. 438/503

OTHER PUBLICATIONS

T.S. Zheleva et al., "Pendo–Epitaxy—A New Approach . . . Structures," Mat. Res. Soc. Symp. Proc., 1999, vol. 537, 6 pgs.

S. Nakamura et al., "InGaN/GaN/AlGaN–Based Laser Diodes . . . Superlattices," Jpn. J. Appl. Phys., 1997, 36:L1568–L1571.

* cited by examiner

*Primary Examiner*—Hoai Ho
*Assistant Examiner*—Mai-Huong Tran
(74) *Attorney, Agent, or Firm*—Gates & Cooper LLP

(57) ABSTRACT

A method, structure and article of manufacture related to hetero-integration of dissimilar semiconductor materials. A mask is created on a semiconductor substrate, wherein the mask includes one or more openings, and each of the openings includes one or more overhangs. The overhangs cover a hetero-epitaxial interface region between a film expitaxially grown on the substrate and the substrate itself, thereby preventing a "line-of-sight" view along a surface norm of the substrate in the hetero-epitaxial interface region between the epitaxial film and the substrate. There is only one hetero-epitaxial interface region for each of the openings, which results in only one epitaxial growth front coalescence per opening, thereby reducing the number of highly defective regions from epitaxial growth front coalescence by a factor of two.

14 Claims, 4 Drawing Sheets

HETERO-INTEGRATION OF DISSIMILAR SEMICONDUCTOR MATERIALS

CROSS-REFERENCE TO RELATED APPLICATION

This application claims priority under 35 U.S.C §119(e) of United States Provisional Patent Application Serial No. 60/151,452, filed Aug. 30, 1999, by Ya-Hong Xie, entitled "Approach for Reducing Dislocation Density in GaN and Related Alloy Crystalline Thin Films," which application is incorporated by reference herein.

BACKGROUND OF THE INVENTION

1. Field of the Invention

This invention relates in general to semiconductor structures, and in particular to hetero-integration of dissimilar semiconductor materials.

2. Description of the Related Art

The material family of GaN (gallium nitride) and related nitride alloys, such as InGaN (indium gallium nitride) and AlGaN (aluminum gallium nitride), has been the subject of intense research. This material family has the promise of being the material of choice for full color displays using LEDs fight emitting diodes) with emission wavelengths covering the entire visible light spectrum, for high density data storage using violet laser diodes, and for high power electronic applications.

The anticipated market size for these lines of products is tremendous. For example, all DVD (digital video disks) manufactured from year 2001 onward will use nitride violet laser diodes.

All the structures demonstrated to date have been fabricated in thin film nitride epitaxially grown on either $Al_2O_3$ (sapphire) or SiC (silicon carbide) substrates. One of the major challenges in nitride technology development is epitaxial material quality. Typical dislocation density is between $10^8$–$10^{10}$ $cm^{-2}$. Threading segments of the dislocations extend in the direction perpendicular to the film surface, and thread through the entire epitaxial film thickness. It has been proven that high dislocation density limits the lifetime of laser devices and carrier mobility in electronic applications.

A variety of approaches have been used to reduce dislocation density. Two of the most successful ones are known as LEO (lateral epitaxial overgrowth) and PE (pendeo-epitaxy). LEO consists of patterning the substrate surface with a $SiO_2$ (silicon oxide) mask, and growing nitride films upward and then sideward from the open areas in the mask. Since dislocations in this crystal structure only thread upwards, the lateral overgrowth portion of the nitride film can be made relatively free of dislocations.

PE represents an improvement over LEO. PE consists of first growing a film of highly dislocated nitride film directly on top of the substrate. This is followed by a patterning step using a mask layer such as $SiO_2$. The nitride film under the open areas in the mask is etched away, and another mask layer is deposited on the bottom of the etched area to prevent nitride nucleation. Finally, a lateral regrowth of nitride film takes place. The film growth follows the direction of lateral, up, and lateral.

PE requires at least one nitride regrowth step, but offers more useable area for device fabrication. This is because PE eliminates the high dislocation density region above the mask openings as in LEO.

Thus, there is a need in the art for a simplified approach to reducing dislocation density in epitaxial films. More specifically, there is a need in the art for a simplified approach that can be used in mass production of devices.

SUMMARY OF THE INVENTION

To minimize the limitations in the prior art described above, and to minimize other limitations that will become apparent upon reading and understanding the present specification, the present invention discloses a method, structure and article of manufacture related to hetero-integration of dissimilar semiconductor materials. A mask is created on a semiconductor substrate, wherein the mask includes one or more openings, and each of the openings includes one or more overhangs. The overhangs cover a hetero-epitaxial interface region between a film expitaxially grown on the substrate and the substrate itself, thereby preventing a "line-of-sight" view along a surface norm of the substrate in the hetero-epitaxial interface region between the epitaxial film and the substrate. There is only one hetero-epitaxial interface region for each of the openings, which results in only one epitaxial growth front coalescence per opening, thereby reducing the number of highly defective regions from epitaxial growth front coalescence by a factor of two.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The present invention represents a simplified approach for further reducing the dislocation density in hetero-epitaxial integration of dissimilar crystalline films. The simplification could prove to be economically advantageous in mass production.

Device Structure

Figure 1:
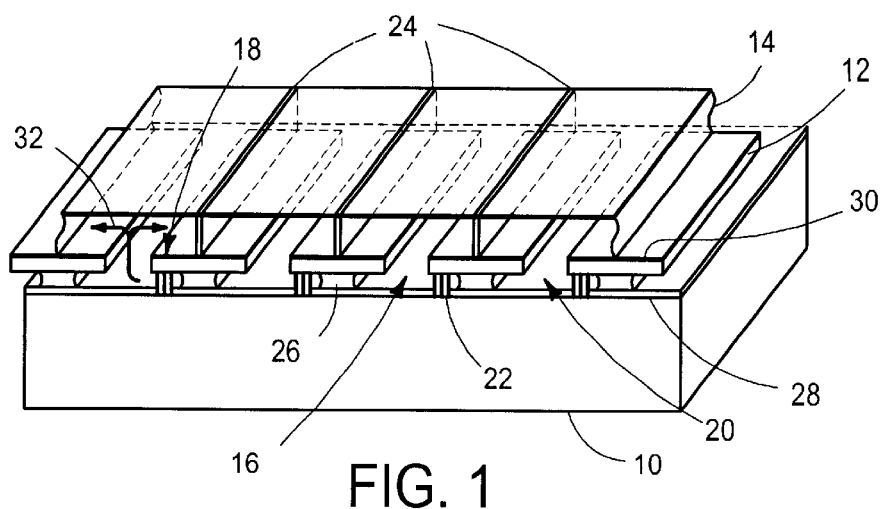
FIGS. 1, 2 and 3 illustrate exemplary device structures according to the preferred embodiment of the present invention.
Figure 2:
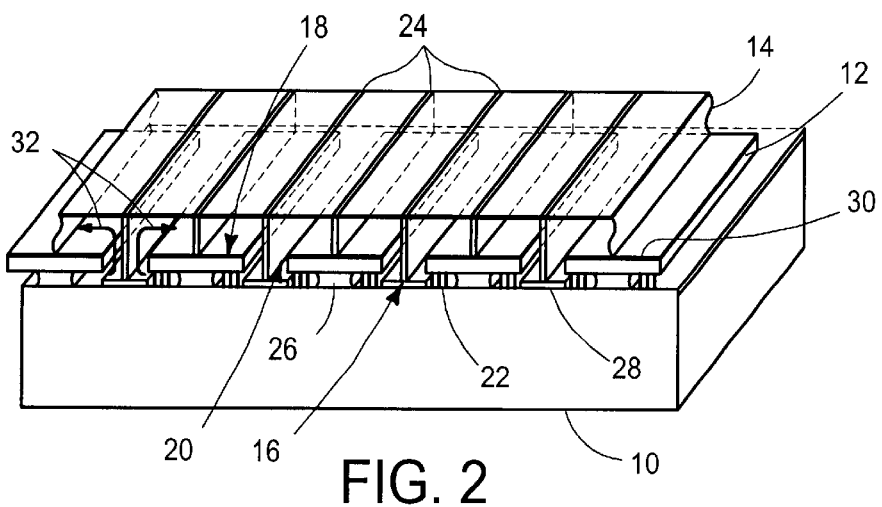
Figure 3:
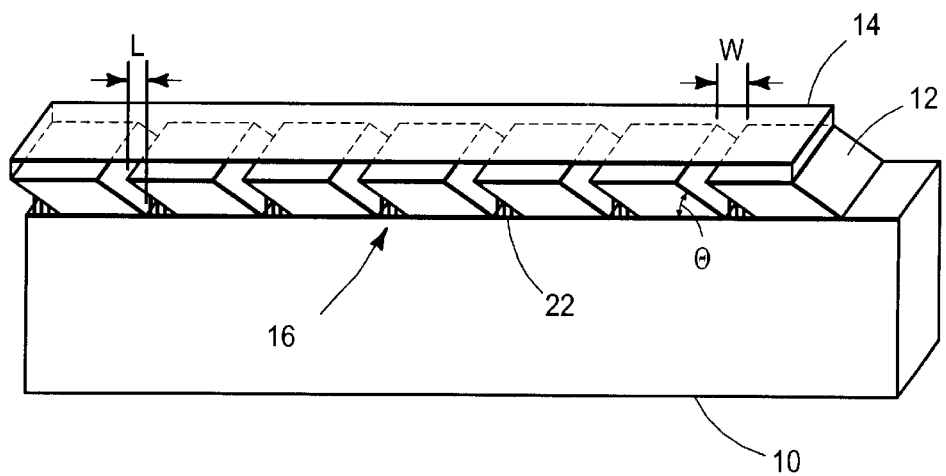

Three different structures representing three preferred embodiments of the present invention are shown in FIGS. 1, 2 and 3. Each of the structures are comprised of a substrate 10, a mask 12, and a film 14 expitaially grown on the masked substrate 10.

In the preferred embodiment, the substrate 10 can be any crystalline material that allows epitaxial growth of the film 14 into a crystalline structure. Typical substrate 10 materials include $Al_2O_3$, SiC, Si (silicon), Ge (germanium), GaAs (gallium arsenide), InP (indium phosphide), etc.

The mask 12 can be made of a variety of different materials. The criteria for judging if a material is suitable as a mask 12 comprise the following:

1. The mask 12 material must be easily deposited onto the substrate 10 without destroying the substrate 10.
2. Normal selective epitaxial growth techniques, such as metallorganic chemical vapor deposition (MOCVD), must be able to avoid nucleation of the epitaxial film 14 on the mask 12.
3. Etching techniques (both isotropic and anisotropic) must be available to etch the mask 12.
4. The mask 12 must be able to withstand the high growth temperature used for epitaxial film 14 growths (typically around 1100° C.).

Typical mask 12 materials used for selective epitaxial growth of the film 14 include $Si_3N_4$ (silicon nitride) and $SiO_2$.

In the preferred embodiment, the epitaxial film 14 is a nitride film 14, such as GaN, InGaN, and AlGaN, although it has been shown that other films 14 could be used as well. Specifically, the same approach is expected to be effective in eliminating dislocations from other technologically important hetero-epitaxial materials combinations, such as InGaAs (indium gallium arsenide) on GaAs for high In concentrations, GaN on a variety of substrates, GaAs on Si, InP on GaAs, etc.

In the present invention, the mask 12 includes one or more openings 16, and each of the openings 16 has one or more overhangs 18 that completely cover a hetero-epitaxial interface region 20. The crux of the present invention is that openings 16 in the mask 12 must not allow a "line-of-sight" view along a surface norm of the hetero-epitaxial interface region 20. These overhangs 18 stop threading dislocations 22 from spreading upward, thereby eliminating them from the epitaxial growth front.

In the preferred embodiment, an optimum configuration has the overhang 18 protruding beyond just above the hetero-epitaxial interface region 20. In this way, a dislocation 22 that propagates upward along a surface norm of the substrate 10, as well as any dislocations 22 that deviate slightly from the surface norm of the substrate 10, are completely blocked by the overhang 18. This technique is named LEO-MEO (Lateral Epitaxy Overgrowth with Mask Edge Overhang).

Another important feature of the present invention is that it calls for the overhang 18 to extend beyond barely covering the epitaxial growth originating area 20. The extra overhang 18 results in a lower density of threading dislocations 22 by preventing them from "leaking" near the edges of the mask 12. This is especially important when the line direction of threading dislocations 22 deviates from the substrate 10 surface norm, due to dislocation-dislocation interactions, or due to the effects of cubic semiconductor materials, such as Si, Ge, GaAs, InP, etc.

The specifics of the three different device structures of FIGS. 1, 2 and 3, as well as the methods for fabricating the device structures, are described below. A specific approach should be chosen to fit a specific application.

The device depicted in FIG. 1 has a mask 12 comprised of an $SiO_2$ film 26 sandwiched between two SiN films 28 and 30, and the epitaxial growth direction is shown by arrows 32. rote that the epitaxial film 14 growth fronts take a winding path from the exposed regions of the substrate 10 surface to over the top surface of the mask 12.) This approach has the advantage of resulting in the largest useable area of defect-free nitride film 14, because each opening 16 in the mask 12 only results in one growth coalescence boundary 24. However, this advantage is at the expense of requiring two levels of photolithography.

The device depicted in FIG. 2 also has a mask 12 comprised of an $SiO_2$ film 26 sandwiched between two SiN films 28 and 30, and the epitaxial growth direction is shown by arrows 32. This approach has the advantage of requiting only one level of photolithography. The SiN film 28 at the bottom of the opening 16 in the mask 12 can be sputtered on self-aligned to the top of the opening 16 in the mask 12. It can provide sufficient protrusion to prevent dislocations 22 slightly deviating from the surface norm of the substrate 10 from "leaking out." However, this approach results in double the number of highly defective regions 24, due to epitaxial growth front coalescence, similar to PE. Moreover, it will not be effective for cubic semiconductor materials, where threading dislocations 22 propagate alone directions quite different from the surface norm of the substrate 10.

The device depicted in FIG. 3 has the simplest structure. The openings 16 in the mask 12 are slanted at an angle θ, thereby providing the opening 16 with a length L and width W relative to the surface norm of the substrate 10, such that dislocations 22 are blocked by the sides of the opening 16 in the mask 12. This approach results only one defective region (not shown) per opening 16. However, it is difficult to create slanted openings 16 in the mask 12 using conventional techniques.

Note that the mask 12 structure depicted in FIG. 2 results in twice the number of the heavily defective regions 24 as compared to the mask 12 structure depicted in FIG. 1, due to growth front coalescence. Note also that the mask 10 structure depicted in FIG. 3 is more difficult to realize using processing technology for Si integrated circuits. However, the mask 10 structure depicted in FIG. 3 offers simplicity in fabrication, if a method of etching the mask 12 material at an angle away from the substrate 10 surface norm is available.

The approach of the present invention is applicable to other material combinations, beyond Group III nitride materials, such as the technologically important GaAs on Si, InGaAs on GaAs, and InGaAs on InP. The major difference between these material combinations, and that of the wurtzic GaN, is the general direction of the threading segments of dislocation 22 half loops. In GaN, threading dislocations 22 propagate along a surface norm of the substrate 10. Threading dislocations 22 in the other materials systems mentioned above are typically inclined with respect to the substrate 10 surface norm However, the same dislocation 22 blockage function of the mask 12 can be achieved by increasing the extent of the overhang 18.

Advantages

The present invention results in a number of advantages over the prior art. These advantages include the following:

1. The present invention does not require two epitaxial growths, as do in both LEO and PE. This reduced processing complexity leads to substantial savings in manufacturing costs.
2. Threading dislocations 22 that are slightly bent away from a surface norm of the substrate 10 may "leak" through the mask 12 in both LEO and PE. As a result, the remaining dislocation 22 density at the expitaxial film 14 surface will be high. In the present invention, the overhang 18 can be adjusted to ensure that no threading dislocations 22 propagate through, thereby providing 100% blocking of dislocations 22.
3. There is only one hetero-epitaxial interface region 20 per mask 12 opening 16, as opposed to two such regions per mask 12 opening 16 in both PE and LEO.

This results in the reduction of the number of highly defective regions 24 from epitaxial growth front coalescence by a factor of two, and corresponding increase in device quality crystalline film 14 areas.

Process Flow

Figure 4:
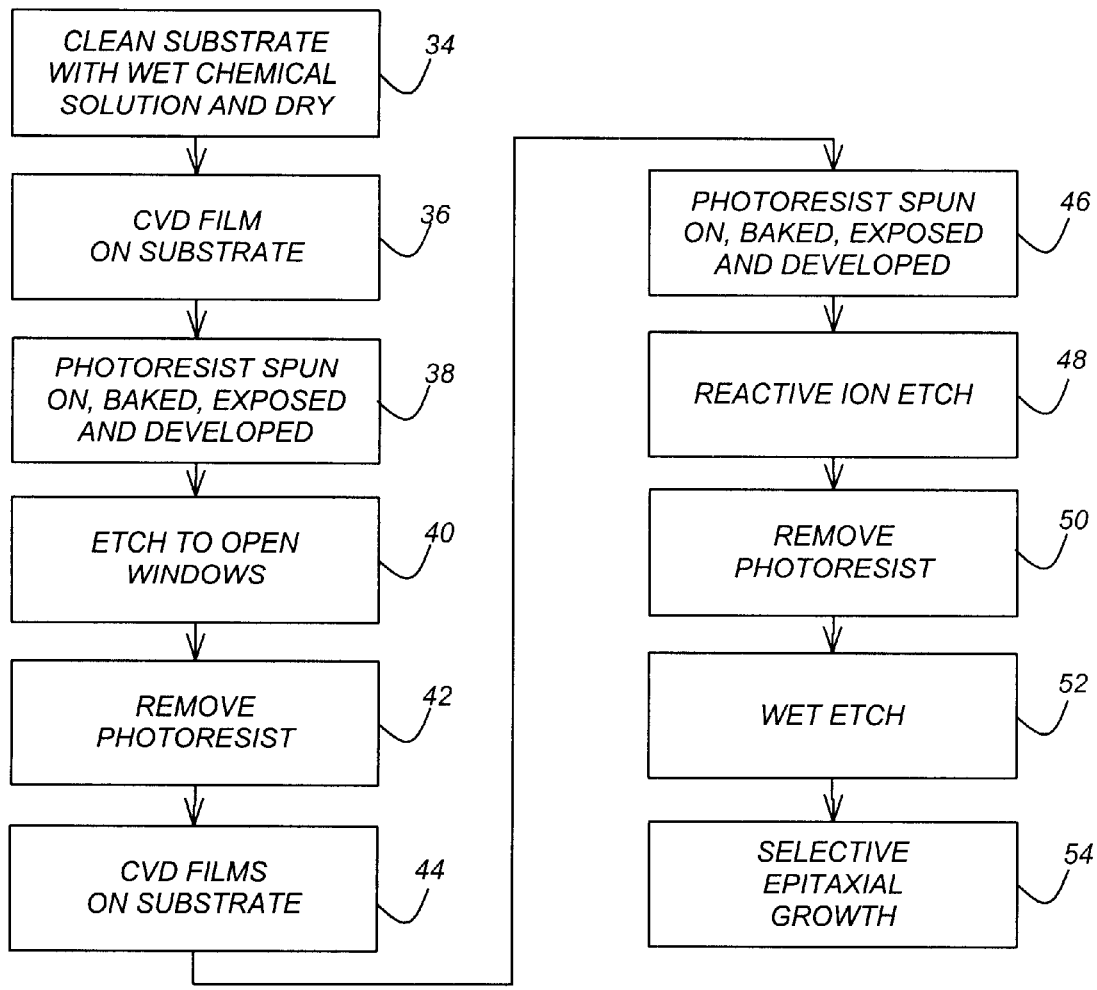
FIGS. 4, 5, and 6 are flowcharts that illustrate exemplary processes used to create the device structures of FIGS. 1, 2 and 3 according to the preferred embodiment of the present invention.
Figure 5:
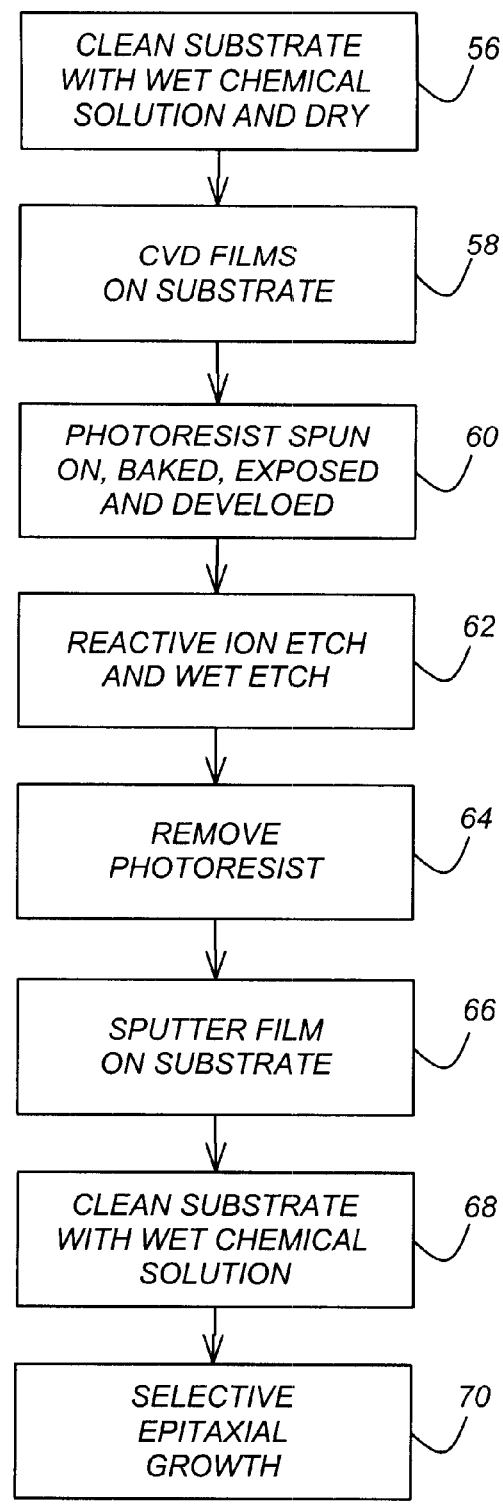
Figure 6:
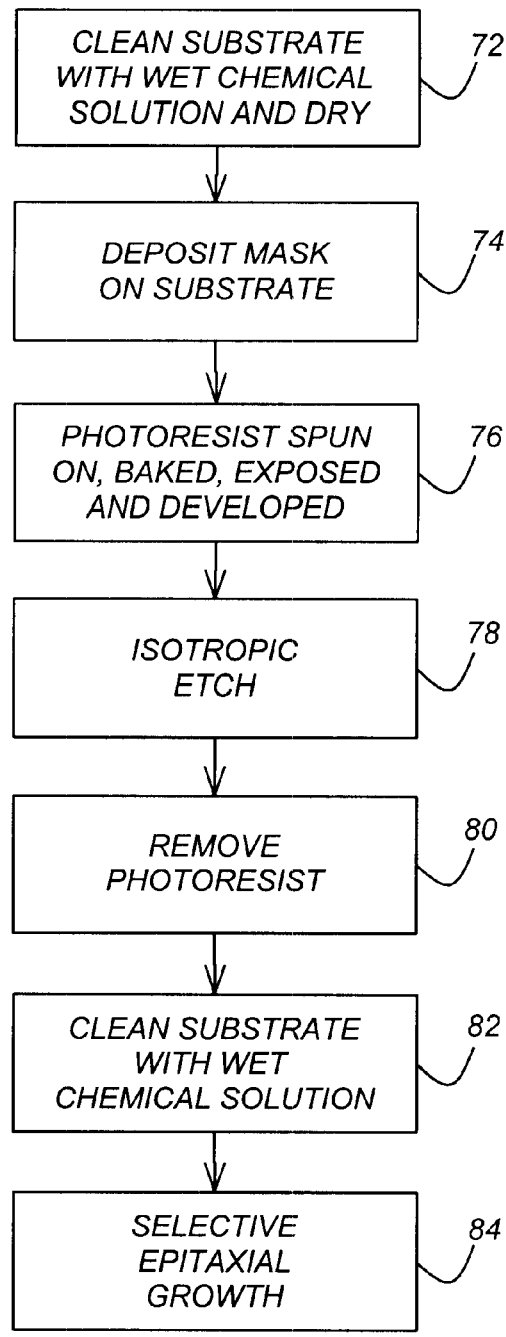

FIGS. 4, 5, and 6 are flowcharts that represent exemplary processes according to the preferred embodiment of the present invention. The flowcharts of FIGS. 4, 5, and 6 are used to fabricate the structures of FIGS. 1, 2, and 3, respectively. Of course, those skilled in the art will recognize that other process steps may be used, e.g., to fabricate the structures of FIGS. 1, 2 and 3 or other equivalent structures, without departing from the scope of the present invention.

Referring to FIG. 4, Block 34 represents an $Al_2O_3$ substrate 10 being cleaned in a wet chemical solution (one commonly used recipe being a hot solution of 3:1 $H_2SO_4$:$H_3PO_4$), and then dried.

Block 36 represents the chemical vapor deposition (CVD) of a 100 nm thick $SiN_x$ film 28.

Block 38 represents a photo-resist film being spun onto the wafer, baked, exposed, and developed following conventional procedures that are well known to one skilled in the art.

Block 40 represents a wet or dry etching step to open windows on the first $SiN_x$ film 28.

Block 42 represents the photo-resist being removed.

Block 44 represents chemical vapor deposition (CVD) of a 200 nm thick $SiO_x$ film 26 followed by another 200 nm thick $SiN_x$ film 30 onto the substrate 10.

Block 46 represents another photo-resist film being spun onto the wafer, baked, exposed, and developed following conventional procedures that are well known to one skilled in the art.

Block 48 represents a reactive ion etching (RIE) being carried out to remove the 200 nm $SiN_x$ film 30 in the area of the openings 16. The openings 16 in the top SiN film 30 are offset from the openings 16 in the lower SiN film 28 to ensure 100% blocking of threading dislocations 22.

Block 50 represents the photo-resist being removed.

Block 52 represents the wafer being subjected to another buffered HF acid etching to expose the openings 16 in the lower SiN film 28 together with the substrate 10 surface at these openings 16.

Block 54 represents a selective epitaxial growth process using MOCVD. A 20 nm thick AlN layer is grown at a low temperature for the purpose of obtaining smooth morphology, as is well known by the ones who are skilled in the art. (See, H. Amano, N. Sawaki, I. Akasaki, and Y. Toyoda, Applied Physics Letters, volume 48, page 353 (1986), which is incorporated by reference herein). The AlN layer is followed by a high temperature selective epitaxial growth of a GaN film 14 at 1100° C. The term "selective epitaxial growth" refers to an epitaxial growth process that does not result in crystal growths on top of the mask 12.

Referring to FIG. 5, Block 56 represents an $Al_2O_3$ substrate 10 being cleaned in a wet chemical solution, and then dried.

Block 58 represents the deposition of a 200 nm thick $SiO_x$ film 26 followed by the deposition of a 200 nm thick $SiN_x$ film 30 onto the substrate 10, both by chemical vapor deposition (CVD). The 200 nm thick $SiO_x$ film 26 serves as an medium for the isotropic etch to form the overhangs 18 from the $SiN_x$ film 30.

Block 60 represents a photo-resist film being spun onto the wafer, baked, exposed, and developed following conventional procedures that are well known to one skilled in the art.

Block 62 represents a reactive ion etching (RIE) being carried out to remove the 200 nm $SiN_x$ film 30 in the area of the openings 16, which is followed by a wet etch using HF (HydroFluoric) acid to etch away the 200 nm $SiO_x$ film 26 under the openings 16 in the $SiN_x$ film 30 to expose the surface of the substrate 10.

Block 64 represents the photo-resist being removed.

Block 66 represents a thin (10 nm) $SiN_x$ film 28 being deposited by sputtering or evaporation. The area covered by the thin $SiN_x$ film 28 is slightly larger than the area of the openings 16 in the mask 12 to ensure 100% blocking of threading dislocations 22. In this embodiment, the openings 16 are comprised of 1 μm wide rectangles extending in length across the entire wafer surface, wherein the rectangles are repeated with a 5 μm period.

Block 68 represents the wafer being subjected to another wet cleaning (one commonly used recipe being a hot solution of 3:1 $H_2SO_4$:$H_3PO_4$) to clean the substrate 10 surface in the area of the openings 16.

Block 70 represents a selective epitaxial growth being performed using MOCVD, wherein a 20 nm thick AlN layer is grown at a low temperature, followed by a high temperature selective epitaxial growth of GaN film 14 at 1100° C.

Referring to FIG. 6, Block 72 represents an $Al_2O_3$ substrate 10 being cleaned in a wet chemical solution (one commonly used recipe being a hot solution of 3:1 $H_2SO_4$:$H_3PO_4$), and then dried.

Block 74 represents the deposition of a mask 12 of suitable material onto the substrate 10.

Block 76 represents a photo-resist film being spun onto the wafer, baked, exposed, and developed following conventional procedures that are well known to one skilled in the art.

Block 78 represents an anisotropic etch being carried out to remove the mask 12 materials in the area of the openings 16, wherein the etch creates openings 16 in the mask 12 that are slanted at an angle θ relative to the surface norm of the substrate 10.

Block 80 represents the photo-resist being removed.

Block 82 represents a wet chemical cleaning of the substrate 10 (one commonly used recipe being a hot solution of 3:1 $H_2SO_4$:$H_3PO_4$).

Block 84 represents a selective epitaxial growth being performed using MOCVD, wherein a 20 nm thick AlN layer is grown at a low temperature, followed by a high temperature selective epitaxial growth of the film 14 at 1100° C.

Note that the mask 12 fabrication of these processes results in one epitaxial film-substrate interface region 20 per opening 16. This reduces the number of defective regions 24 due to growth front coalescence by a factor of two. Moreover, these processes require only one epitaxial growth step to form the film 14.

Conclusion

This concludes the description of the preferred embodiment of the invention. In summary, the present invention discloses a method, structure and article of manufacture related to hetero-integration of dissimilar semiconductor materials. A mask is created on a semiconductor substrate, wherein the mask includes one or more openings, and each of the openings includes one or more overhangs. The overhangs cover a hetero-epitaxial interface region between a film expitaxially grown on the substrate and the substrate itself, thereby preventing a "line-of-sight" view along a surface norm of the substrate in the hetero-epitaxial interface region between the film and the substrate. There is only one hetero-epitaxial interface region for each of the openings, which results in only one epitaxial growth front coalescence per opening, thereby reducing the number of highly defective regions from epitaxial growth front coalescence by a factor of two.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for producing hetero-integration of dissimilar semiconductor materials, comprising:

(a) creating a mask on a substrate, wherein the mask includes one or more openings and one or more overhangs for each of the openings, and the overhangs cover a hetero-epitaxial interface region between an epitaxial film applied onto the substrate and the substrate itself; and (b) performing a selective epitaxial growth of the epitaxial film onto the masked substrate.

2. The method of claim 1, wherein the overhangs prevent a "line-of-sight" view along a surface norm of the substrate in the hetero-epitaxial interface region between the epitaxial film and the substrate.

3. The method of claim 1, wherein the overhang reduces dislocation density in the epitaxial film laterally grown on top of the mask.

4. The method of claim 1, wherein the overhang protrudes beyond just above the hetero-epitaxial interface region between the epitaxial film and the substrate, thereby preventing dislocation leakages near one or more edges of the mask.

5. The method of claim 1, wherein one or more dislocations are blocked by the overhang.

6. The method of claim 5, wherein the dislocations propagate upward along a surface norm of the substrate.

7. The method of claim 5, wherein the dislocations propagate upward along a deviation from a surface norm of the substrate.

8. The method of claim 1, wherein the substrate is selected from a group consisting of sapphire ($Al_2O_3$), silicon (Si), silicon carbide (SiC), GaAs (gallium arsenide), Ge (germanium), and InP (indium phosphide).

9. The method of claim 1, wherein the mask is comprised of a material that meets the following criteria:

the material is easily deposited onto the substrate without destroying the substrate, the selective epitaxial growth is able to avoid nucleation of the epitaxial film on the mask, both isotropic and anisotropic etching techniques are available to etch the mask, and the material is able to withstand high temperatures used for growth of the epitaxial film.

10. The method of claim 1, wherein the mask is selected from a group of materials consisting of silicon nitride ($Si_3N_4$) and silicon oxide ($SiO_2$).

11. The method of claim 1, wherein the epitaxial film is selected from a group of materials consisting of GaN (gallium nitride), InGaN (indium gallium nitride), AlGaN (aluminum gallium nitride), Ge (germanium), GaAs (gallium arsenide), InGaAs (indium gallium arsenide) for high In concentrations, and InP (indium phosphide).

12. A method for producing hetero-integration of dissimilar semiconductor materials, comprising:

(a) creating a mask on a substrate, wherein the mask includes one or more openings; and (b) performing a selective epitaxial growth of an epitaxial film onto the masked substrate, wherein there is only one hetero-epitaxial interface region for each of the openings.

13. The method of claim 12, wherein the only one hetero-epitaxial interface region results in only one epitaxial growth front coalescence per opening.

14. The method of claim 12, wherein the only one hetero-epitaxial interface region reduces the number of highly defective regions from epitaxial growth front coalescence by a factor of two.

* * * * *